United States Patent
Gomi

[19]
[11] Patent Number: 6,115,110
[45] Date of Patent: Sep. 5, 2000

[54] PRESSURE-DEVELOPING DEVICE AND RECORDING DEVICE

[75] Inventor: Masao Gomi, Okaya, Japan

[73] Assignee: Cycolor System Inc., Japan

[21] Appl. No.: 09/117,247

[22] PCT Filed: Nov. 27, 1997

[86] PCT No.: PCT/JP97/04363
 § 371 Date: Jul. 27, 1998
 § 102(e) Date: Jul. 27, 1998

[87] PCT Pub. No.: WO98/24001
 PCT Pub. Date: Jun. 4, 1998

[30] Foreign Application Priority Data

Nov. 29, 1996 [JP] Japan .................................. 8-319561

[51] Int. Cl.[7] ............................................. G03B 27/00
[52] U.S. Cl. ............................ 355/407; 355/27; 355/72
[58] Field of Search ............................ 355/27, 40, 407, 355/72, 73

[56] References Cited

U.S. PATENT DOCUMENTS

| | | | |
|---|---|---|---|
| 4,648,699 | 3/1987 | Holycross et al. | 354/297 |
| 5,068,684 | 11/1991 | Abe et al. | 355/27 |
| 5,077,574 | 12/1991 | Tamagaki et al. | 355/40 |
| 5,140,378 | 8/1992 | Ibuchi et al. | 355/295 |
| 5,309,196 | 5/1994 | Sanders | 355/27 |
| 5,550,627 | 8/1996 | Dowler et al. | 355/326 |
| 5,764,382 | 6/1998 | Shiraishi | 358/496 |
| 5,884,114 | 3/1999 | Iwasaki | 396/583 |
| 6,059,284 | 5/2000 | Wolf et al. | 271/227 |

FOREIGN PATENT DOCUMENTS

| | | |
|---|---|---|
| 62-161153 | 7/1987 | Japan . |
| 63-70254 | 3/1988 | Japan . |
| 3142461 | 6/1991 | Japan . |
| 3240058 | 10/1991 | Japan . |

*Primary Examiner*—Russell Adams
*Assistant Examiner*—Khaled Brown
*Attorney, Agent, or Firm*—Thompson Hine & Flory LLP

[57] ABSTRACT

A pressure developing unit moving along a surface of a cycolor medium to perform pressure development has a first rotating member that faces a platen and is capable of performing pressure development of a recording sheet, and a second rotating member that is capable of transmitting a load applied to the first rotating member to a carriage shaft. If the pressure developing unit is moved along the carriage shaft, the first and second rotating members move by revolving along the recording sheet and the carriage shaft respectively in a direction in which the pressure developing unit moves, so that there is no possibility of sliding friction being caused. The pressure developing unit can be moved along the carriage shaft causing only rolling friction. Thus, it is possible to reduce the size of a motor for moving the pressure developing unit and to realize thereby a recorder that is compact in size and low in power consumption.

16 Claims, 10 Drawing Sheets

Scanning directions B

Scanning directions B ⟷

PRESSURE-DEVELOPING DEVICE AND RECORDING DEVICE

TECHNICAL FIELD

The present invention relates to an apparatus for performing pressure development of a recording sheet such as a Cycolor medium that necessitates pressure development in a process of producing a color print, and it also relates to a recorder having such an apparatus.

BACKGROUND ART

A color printing method for implementing a process of pressure development is known. This method includes the steps of exposing a photosensitive medium coated with minute capsules containing color forming materials, activating or deactivating the capsules in accordance with an image, and rupturing the activated capsules by pressurizing the exposed medium. A cycolor medium 1 as illustrated in FIG. 14 is an example of such a medium. The cycolor medium 1 is a medium having a film 2 made of polyester or the like, the film 2 being coated with an infinite number of microcapsules called cyliths 3a to 3c. Each of the cyliths 3a to 3c contains one of color forming materials of cyan, magenta and yellow and a sensitive material called a photo initiator that is sensitive to light of a specific wavelength. The photo initiator contained in each of the cyliths 3a to 3c hardens if it is irradiated with light of a specific wavelength, for example, light of a complementary color of each of the cyliths 3a to 3c. Accordingly, it is possible to deactivate the color forming reaction of a color forming material contained in a cyliths depending on the wavelength of light emitted.

The cycolor medium 1 undergoes pressure development in which the cyliths 3a to 3c of three different colors are irradiated with light and subjected to a high pressure so that the activated cyliths 3a to 3c are crushed. The development method of this kind causes a chemical reaction between the color forming materials contained in the cyliths 3a to 3c and a transparent image-receiving layer called a receiver 4 that is made of polyester or the like, thereby a predetermined color image is recorded (printed) on the cycolor medium 1 which is a recording medium. For example, if only red light is emitted, only the photo initiator contained in the cyliths 3a of cyan hardens. The cyliths 3b of magenta and the cyliths 3c of yellow are crushed due to pressurization, whereby the color forming materials of magenta and yellow develop their respective colors. Thus, those color-forming materials are mixed to develop red color. Similarly, if green light is emitted, the cyliths 3a of cyan and the cyliths 3c of yellow are crushed to develop green color. If blue light is emitted, the cyliths 3a of cyan and the cyliths 3b of magenta are crushed to develop blue color.

Thus, a photosensitive medium such as the cycolor medium 1 needs to be subjected to pressure development after being exposed. As a pressure developing apparatus therefor, pressure means composed of a pair of rollers that are vertically disposed is generally employed. By conveying the cycolor medium (medium) 1 into a gap between the rollers and entirely pressurizing the medium 1, pressure development is performed.

To sufficiently pressurizing the medium using such rollers, those components which are strengthened enough to endure a comparatively high developing pressure, such as rollers, bearings, frames and the like are required. To homogeneously pressurizing the entire medium, at least one of the rollers needs to be shaped like a drum by being subjected to a crowning processing. Thus, the pressure developing apparatus becomes larger, heavier and more expensive.

In view of such backgrounds, it has been considered to replace the conventional pressure developing apparatus employing rollers with a pressure developing apparatus that pressurizes a recording sheet by a small ball (development ball) reciprocating with respect to the surface of a medium (printing sheet or recording sheet) in scanning directions. Since the development ball contacts a point of the surface of the recording sheet, the contact area between the development ball and the recording sheet is very small. Thus, by a small force, it is possible to significantly enhance a pressure per area, so that the pressure developing apparatus can be made smaller and lighter than those employing rollers. Further, since the development ball does not necessitate a special processing such as a crowning processing, the pressure developing apparatus and the recorder employing the pressure developing apparatus can be provided at low costs.

FIG. 15 illustrates an example of the recorder (printer) employing a pressure developing apparatus having a development ball. The recorder 10 has an exposure unit 20 for exposing the aforementioned cycolor medium 1 to form an image, a pressure developing apparatus 30 moving along the surface of the medium 1 exposed by the exposure unit 20 in scanning directions that are perpendicular to a sheet-conveying direction A to perform pressure development, a slab-like face plate (supportive plate or platen) 11 disposed above the pressure developing apparatus 30, and a sheet-conveying mechanism 60 for conveying the medium 1 exposed by the exposure unit 20 toward the pressure developing apparatus 30 by sandwiching the medium 1 between a main roller 61 and an auxiliary roller 62. The exposure unit 20 and the pressure developing apparatus 30 are mounted on a carriage 53, which reciprocates along carriage shafts 51 and 52 extending in the scanning directions by drive means such as a motor 6 and a timing belt 7. The exposure apparatus 20 reciprocates in the scanning directions to expose the medium dot by dot, thus forming an image. Then the pressure developing apparatus 30 sequentially perform pressure development of the exposed medium 1, thus outputting a color-printed cycolor medium. As a matter of course, the arrangement of the platen 11 and the pressure developing apparatus 30 can be reversed. Further, it is also possible to horizontally arrange the platen 11 and the pressure developing apparatus 30.

The exposure apparatus 20, which can employ an LED head 21 having LED's capable of irradiating the medium 1 with three different lights of red (R), green (G) and blue (B), is moved by the carriage 53 to irradiate each of the cyliths 3a to 3c forming each dot with a light of a suitable color. Thus, it is possible to deactivate the cyliths 3a to 3c dot by dot on the basis of image data sent from a personal computer or the like, and to record the image on the cycolor medium 1 (to expose the cycolor medium 1).

The pressure developing apparatus 30 moves together with the exposure apparatus 20 and performs pressure development of the exposed medium 1 that has been conveyed by the sheet-conveying mechanism 60. The pressure developing apparatus 30 has a rectangular parallelepiped housing 31 extending toward the medium 1 and a development ball 39 partially protruding from the side of the medium 1 of the housing 39. The development ball 39 is pressed against the platen 11 by a spring 37 accommodated in the housing 31. It is possible to perform pressure development of the medium 1 by sandwiching the medium 1 between the platen 11 and the development ball 39.

The pressure developing apparatus 30 employing the development ball 39 as described above can pressurize the medium 1 over an extremely small (local) area that is almost considered to be a spot or a point. As the pressure developing apparatus 30 moves, the point to which a pressure is applied continuously moves. Thus, it is possible to ensure a pressure level sufficient to perform development with a relatively small force as obtained from a simple elastic body such as a thin spring or an elastic mechanism. Thus, it is unnecessary to use a large roller, whereby the entire recorder can be significantly reduced in size and weight. Further, since the development ball moves by revolving along the surface of the medium 1, it is possible to pressurize the medium 1 without causing a damage thereto. Therefore, by employing the pressure developing apparatus 30 thus constructed, it becomes possible to reduce the recorder 10 in size and weight, and to provide a recorder that is capable of outputting a high-quality color print at low costs.

However, it has been considered to further improve the aforementioned pressure developing apparatus 30 to make it possible to provide a recorder that is more compact and less expensive. For example, the pressure developing apparatus as illustrated in FIG. 15 is designed such that the carriage shaft 52 receives a reaction force generated in performing pressure development via the carriage 53 and that the pressure developing apparatus 30 moves along the carriage shaft 52. Accordingly, the reaction force for performing pressure development increases a frictional force generated between the carriage 53 and the carriage shaft 52. To reciprocate the carriage 53 smoothly along the carriage shafts 51 and 52, it is necessary to prepare a drive motor having sufficient large outputs to counteract the frictional force. A drive motor with a great driving force is bulky and requires a large installation space. Therefore, an attempt to ensure an installation space for such a high-output drive motor poses a serious problem in reducing the size of the recorder.

The drive motor with high outputs is accompanied by high power consumption. In the recorder employing the cycolor medium 1, the exposure apparatus is a contactless type and can be reduced in size, and expendable supplies such as a ribbon, a toner and the like are not required. Thus, the recorder of this manner can be reduced to a size genuinely suited for conveyance. To realize a portable recorder, it is required that the recorder be capable of operating for a long period of time with a power source of limited energy such as a battery. Hence, it is necessary to reduce the electric power consumed by a drive motor to the minimum possible value. In addition, since a large motor requires a high cost, it is desirable to use a low-power motor with a view to reducing the cost of the recorder.

Therefore, for the purpose of reducing the size and cost of the recorder as well as power consumption, it is indispensable to downsize the drive motor. It is thus an object of the present invention to provide a pressure developing apparatus that can be driven with less power and apply a sufficient pressure. That is, the present invention aims at providing a pressure developing apparatus that can be moved in scanning directions with a small force and develop a high-quality color print by sufficiently pressurizing the medium. It is another object of the present invention to downsize the recorder by making the pressure developing apparatus to be installed in a narrow space. It is still another object of the present invention to reduce the motor power necessary for moving the carriage including the pressure developing apparatus and to realize a compact and low-cost recorder that is low in power consumption and suited for conveyance.

DISCLOSURE OF THE INVENTION

A pressure developing apparatus according to the present invention is provided with a first rotating member such as a development ball that moves along a recording sheet while pressurizing the recording sheet, and a second rotating member that can move by revolving along a supportive member such as a carriage shaft, whereby the second rotating member transmits a load applied to the first rotating member to the supportive member. That is, the pressure developing apparatus according to the present invention that moves along the supportive member for pressuring the recording sheet is characterized by including the first rotating member that moves by revolving to pressurize the recording sheet and the second rotating member that moves by revolving with respect to the supportive member and can transmit a load applied to the first rotating member to the supportive member. By providing the pressure developing apparatus comprising the second rotating member, it is possible to move the first rotating member with respect to the supportive member not by sliding friction but by rolling friction of the second rotating member. Therefore, the pressure developing apparatus can be moved along the supportive member with a small force.

Since the frictional force generated relative to the supportive member becomes small, the first rotating member can be smoothly moved along the supportive member with a small force and at a substantially constant speed. Therefore, the speed at which the first rotating member moves and the pressure applied to the recording sheet hardly fluctuate, whereby it is possible to pressurize the recording sheet sufficiently and more homogeneously. As a result, it is possible to develop a high-quality color print.

Thus, the pressure developing apparatus according to the present invention can be moved along the supportive member such as the carriage shaft by a low-output motor, and, the pressure developing apparatus of this invention can provide a high-quality image. Therefore, a high-performance recorder can be provided using a compact and low-output motor, whereby it is possible to reduce the size of the recorder as well as electric power consumption. That is, the recorder having: the pressure developing apparatus according to the present invention; an exposure apparatus for exposing a photosensitive recording sheet; a sheet-conveying apparatus for conveying the recording sheet exposed by the exposure apparatus to the pressure developing apparatus; and a driving apparatus for causing the pressure developing apparatus to reciprocate along a supportive member extending in scanning directions that are substantially perpendicular to a sheet-conveying direction of the sheet-conveying apparatus, makes it possible to downsize the driving apparatus by reducing power therefor. It is thus possible to provide recorder that is the size is compact, low in power consumption and suited for conveyance. Since this recorder is low in power consumption, it is possible to further downsize the recorder including a power source section for accommodating batteries and the like.

As the first rotating member of the pressure developing apparatus according to this invention, it is possible to employ a member that is shaped so as to contact the recording sheet locally and continuously, such as a ball, a roller of a narrow width, a disc or the like. To achieve a state of continuous contact with the recording sheet over an even smaller area so that a high pressure can be easily obtained, it is also possible to employ a rotary member that has ring-like protrusions on its surface. By localizing the contact area between the rotating member and the recording sheet, it is possible to provide a pressure developing apparatus that is more compact in size and more excellent in developing performance. It is also possible that on a sheet-supportive member, which supports the recording sheet from a side opposite to the first rotating member, a protrusion is provided extending in a direction in which the first rotating member moves in an area where the first rotating member moves. In this arrangement, the area of the recording sheet pressurized by the first rotating member is also localized. Therefore, it is possible to provide a pressure developing apparatus that is compact and excellent in developing performance.

The second rotating member can be disposed between the first rotating member and the supportive member such that the second rotating member can move by revolving while being in contact with the first rotating member and the supportive member. As the pressure developing apparatus moves, the first rotating member moves by revolving in a direction in which the pressure developing apparatus moves while pressurizing the recording sheet, and the second rotating member also moves in the direction in which the pressure developing apparatus moves while being in contact with the supportive member. Since the first rotating member is directly in rolling contact with the second rotating member, there is no sliding friction caused when the pressure developing apparatus moves. Thus, the pressure developing apparatus can be moved with a considerably small force. Consequently, it is possible to further reduce the outputs of the drive motor necessary for moving the pressure developing apparatus.

Although this pressure developing apparatus is designed such that the first rotating member revolves relative to the supportive member in a direction opposed to the direction in which the pressure developing apparatus moves, the second rotating member, which revolves relative to the supportive member in the direction in which the pressure developing apparatus moves, can directly support the first rotating member from of the supportive member. Thus, it is easy to ensure a sufficient pressure level, and it is unnecessary to employ an intermediate member, such as a spring, for transmitting a load applied to the first rotating member to the supportive member. Consequently, the installation space for the spring can be omitted, whereby the pressure developing apparatus can be further reduced in size.

To apply stable pressure on the recording sheet over a long period of time in consideration of factors such as erection tolerances of the pressure developing apparatus or the recorder, abrasion of the rotary members and the like, it is desirable to ensure or compensate for a predetermined level of developing pressure using an elastic member such as a spring. Further, since the recording sheet has a certain thickness, when the pressure developing apparatus is moved across the recording sheet from one end to the other end, a gap formed between the pressure developing apparatus and the sheet-supportive member that supports the recording sheet from the side opposite to the first rotating member, fluctuates depending on whether the recording sheet is in the gap or not. Therefore, it is necessary to enable a predetermined pressure to be applied even if the gap formed between the first rotating member and the sheet-supportive member somewhat fluctuates. Hence, in the case of adopting the above pressure developing apparatus in which the first and second rotating members are directly connected with each other, the pressure developing mechanism is desirably that having a pressure supportive apparatus for elastically supporting the sheet-supportive member to pressurize the first rotating member.

However, if the sheet-supportive member is elastically supported, the sheet-supportive member may subtly vibrate when the pressure developing apparatus passes an edge of the recording sheet. The pressure applied to the recording sheet thereby fluctuates, so that the image developed on the edge portion of the recording sheet may suffer color non-uniformity. To inhibit the generation of such a color non-uniformity (shade, irregularity), it is desirable to provide a transmission apparatus for elastically transmitting a load applied to the first rotating member to the second rotating member. By this arrangement, the rotary member of light weight can absorb the unevenness (gap difference) at the edge portion of the recording sheet, so that it is possible to inhibit pressure fluctuations and to form (develop) a color image exhibiting a high color developing quality even on the edge portions of the recording sheet. Further, since the unevenness resulting from the edge portion of the recording sheet can be absorbed by the first rotating member having light weight, it is advantageously possible to further reduce the driving power required to move the pressure developing apparatus.

To transmit a load applied to the first rotating member to the second rotating member, it has been considered to couple the first rotating member to the second rotating member via an elastic member such as a spring. However, if the elastic member is linearly disposed between the first and second rotating members, the distance between the first and second rotating members becomes longer, whereby it may become difficult to downsize the pressure developing apparatus. Thus, with a view to reducing the recorder accommodating the pressure developing apparatus in size, particularly in thickness, it is desirable to establish an arrangement in which a center of rotation of the second rotating member is offset relative to a center of rotation of the first rotating member. To transmit a load applied to the first rotating member to the second rotating member, it is possible to employ, for example, a transmission apparatus having arms for supporting the first and second rotating members respectively, which arms are coupled to each other by an elastic member.

It is also effective to arrange the first rotating member and two pieces of the second rotating member such that the first rotating member moves by revolving while invariably contacting these two second rotating members. In this manner, the arrangement in which the centers of rotation of the first and second rotating members are offset with respect to each other is established. Thus, as described above, it is possible to provide a pressure developing apparatus that can be disposed within a narrow space. It is also possible to provide plural pieces of the first rotating member or to arrange plural sets of both the first and second rotating members. In addition, by installing a holding apparatus for applying an elastic force in such a direction as to reduce the distance among the first rotating members or among the second rotating members, the difference of stage at the edge of the recording sheet can be smoothly absorbed.

It is also effective to provide a guide member along a direction in which the first rotating member moves and the guide member can be deformed into a substantially smooth shape corresponding to a cross section of the recording sheet. In passing the edge of the recording sheet, the first rotating member moves along the guide member deformed a smooth shape, thus the vibration of the sheet-supportive member or the pressure developing apparatus can be damped. Therefore, it is possible to inhibit the generation of color irregularities. The guide member may be a metallic wire, a thin metallic member having a shape of a strip, or the like. However, in the case where the first rotating member pressurizes the recording sheet via such a guide member, the contact area between the guide member and the recording sheet increases, whereby it becomes necessary to increase the force applied by the first rotating member. Hence, it is desirable to employ as the guide member a number of small divided pieces ranging along a direction in which the first rotating member moves, and to pressurize each of the small pieces using the first rotating member so as to prevent the pressure from being dispersed.

BEST MODES FOR CARRYING OUT THE INVENTION

First Embodiment

Figure 1:
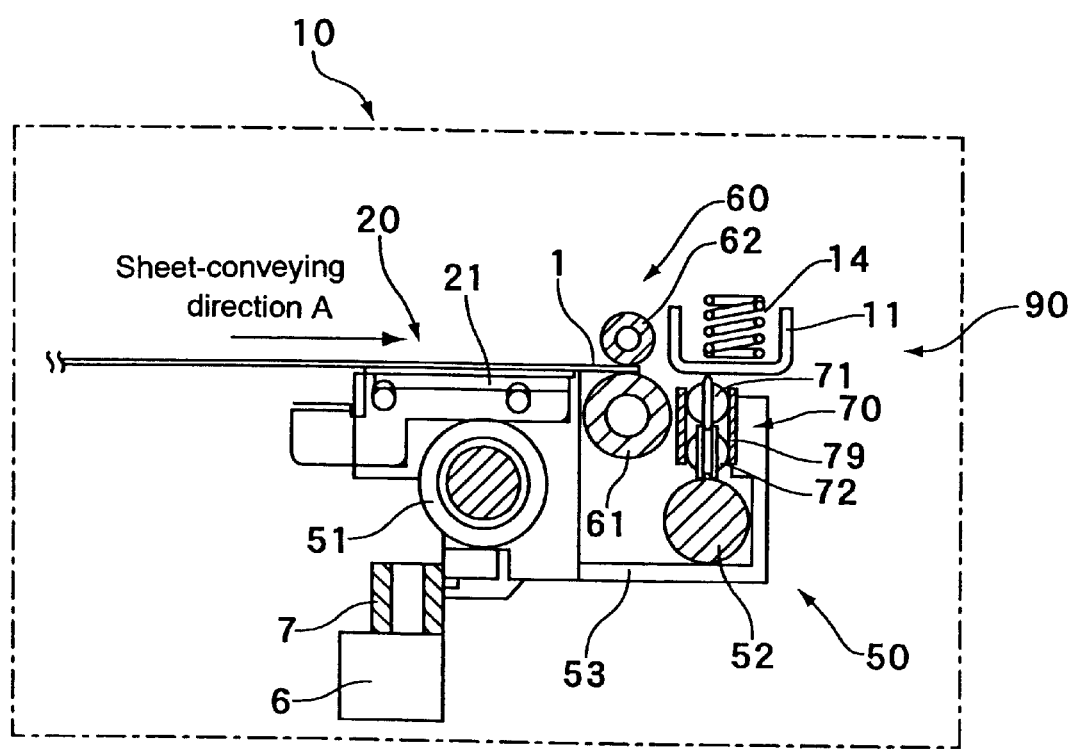
FIG. 1 schematically illustrates a recorder employing a pressure developing unit and a pressure developing mechanism according to an embodiment of the present invention.

A recording apparatus according to an example of the present invention will hereinafter be described with reference to the accompanying drawings. FIG. 1 schematically illustrates the structure of the recorder having a pressure developing mechanism 90 of the present invention. The recorder 10 of the present embodiment is a recorder for a cycolor medium 1, as is the case with the recorder described based on FIG. 15. In the recorder 10, an exposure unit 20 and a pressure developing unit 70 are laid on a carriage 53 and able to move in scanning directions perpendicular to a sheet-conveying direction A of a sheet-conveying mechanism 60. The exposure apparatus 20 moves in the scanning directions by means of the carriage 53 and exposes the cycolor medium (medium) 1 as a recording sheet. The exposed medium 1 is conveyed toward the pressure developing mechanism 90 comprising a platen 11 and the pressure developing unit 70 moving in the scanning directions along a surface of the platen 11. The pressure developing unit 70 reciprocates along the surface of the medium 1 while applying pressure thereto, so that an exposed color image is developed. Those components that are commonly used in the recorder described based on FIG. 15 will hereinafter be denoted by the same reference numerals, and the detailed description thereof will be omitted.

The pressure developing unit 70 employed in the recorder 10 of this embodiment comprises first and second rotating members 71 and 72 which are vertically disposed. These rotary members 71 and 72 are accommodated in a housing 79 and mounted on the carriage 53 together with the exposure unit 20, so that they can move in the scanning directions. When moving, the first rotating member 71 is in contact with the plate-like platen 11 that is a sheet-supporting member. The first rotating member 71 is a member for performing pressure development of the medium 1 by sandwiching it between the platen 11 and the first rotating member 71. The second rotating member 72 moves by revolving between the carriage shaft 52, which is a supportive member, and the first rotating member 71, contacting with the first rotating member 71 and the carriage shaft 52. The second rotating member 72 is a member for transmitting a load applied to the first rotating member 71 to the carriage shaft 52.

Figure 15:
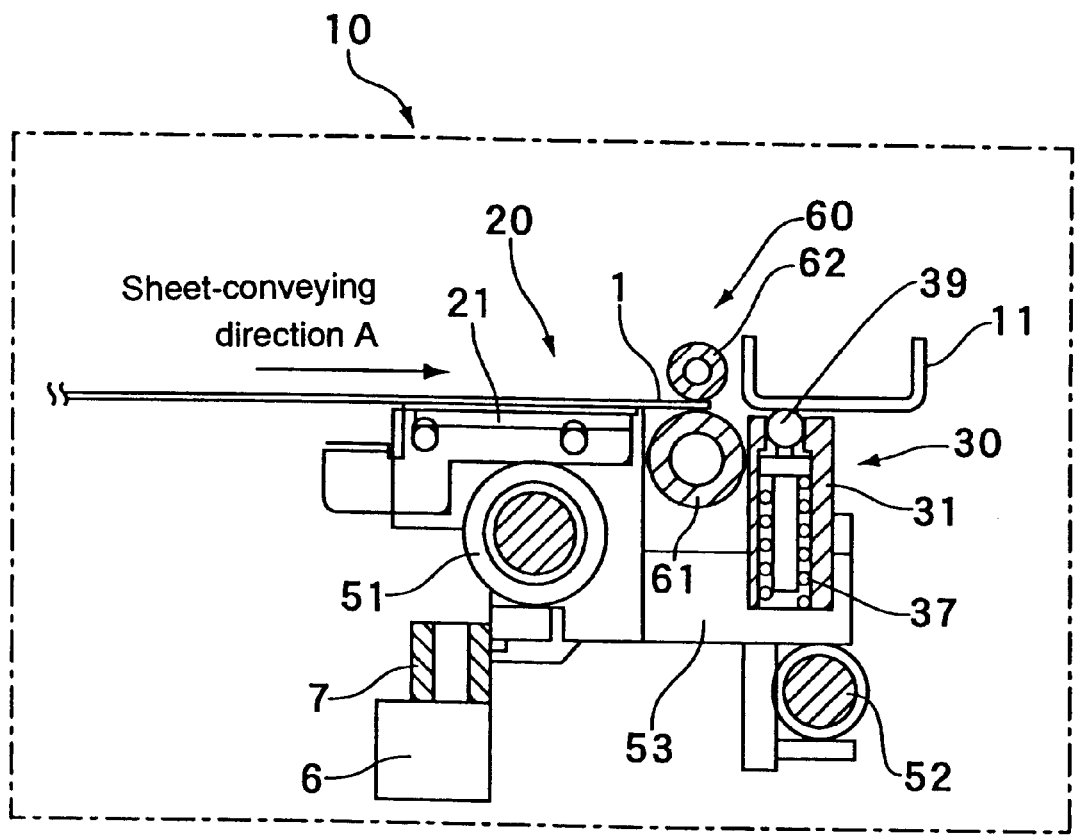
FIG. 15 schematically illustrates the overall structure of a recorder having a pressure developing apparatus employing a development ball.

The pressure developing unit 70 of this embodiment allows the second rotating member moving by revolving along the carriage shaft 52 to directly receive a load applied to the first rotating member 71 which moves with pressurizing the recording sheet 1. Hence, while the first rotating member 71 performs pressure development, it is possible to move the pressure developing unit 70 along the carriage shaft 52 not by sliding friction but by rolling friction of the second rotating member 72. A reaction force of a pressure applied to the platen 11 by the first rotating member 71 is transmitted by the second rotating member 72 that moves by rotating on the carriage shaft 52, therefore the frictional resistance becomes extremely small. Hence, the driving power for moving the carriage 53 in the scanning directions, while ensuring a pressure force sufficient for development, is much smaller than the driving power of the recorder as illustrated in FIG. 15, in which the pressure developing unit moves by sliding friction. Accordingly, it is possible to reduce outputs power of a drive motor 6 for driving the carriage 53 in the scanning directions, and to reduce an installation space for a motor in the recorder 10 by downsizing the motor. By decreasing required power of the motor, it is possible to reduce the costs of the motor and an accompanying power source. Hence, the recorder 10 being compact and light in weight can be provided at low costs. In addition, since a smaller output drive motor can drive the carriage 53, it is possible to significantly reduce power consumption and the recorder can be used by batteries' power practically. Accordingly, the compact and low power consumption recorder suitable for portable use can be provided by the invention.

Further, in the pressure developing unit 70 of this embodiment, the second rotating member 72 can transmit a load applied to the first rotating member 71 to the carriage shaft 52 by rotating on the carriage shaft 52 in a direction to the pressure developing unit 70 moves. Therefore, it is unnecessary to temporarily receive the load applied to the first rotating member 71 using a spring or the like for transmitting the load to the carriage shaft 52. Accordingly, it is possible to omit an installation space for an intermediate member, such as spring, for obtaining a pressure force to be applied, so that the pressure developing unit 70 becomes more compact. Hence, it is possible to achieve an entirely compact and thin structure of a recording mechanism 50 of the recorder, and it is possible to reduce the size and price of the recorder 10.

Figure 2:
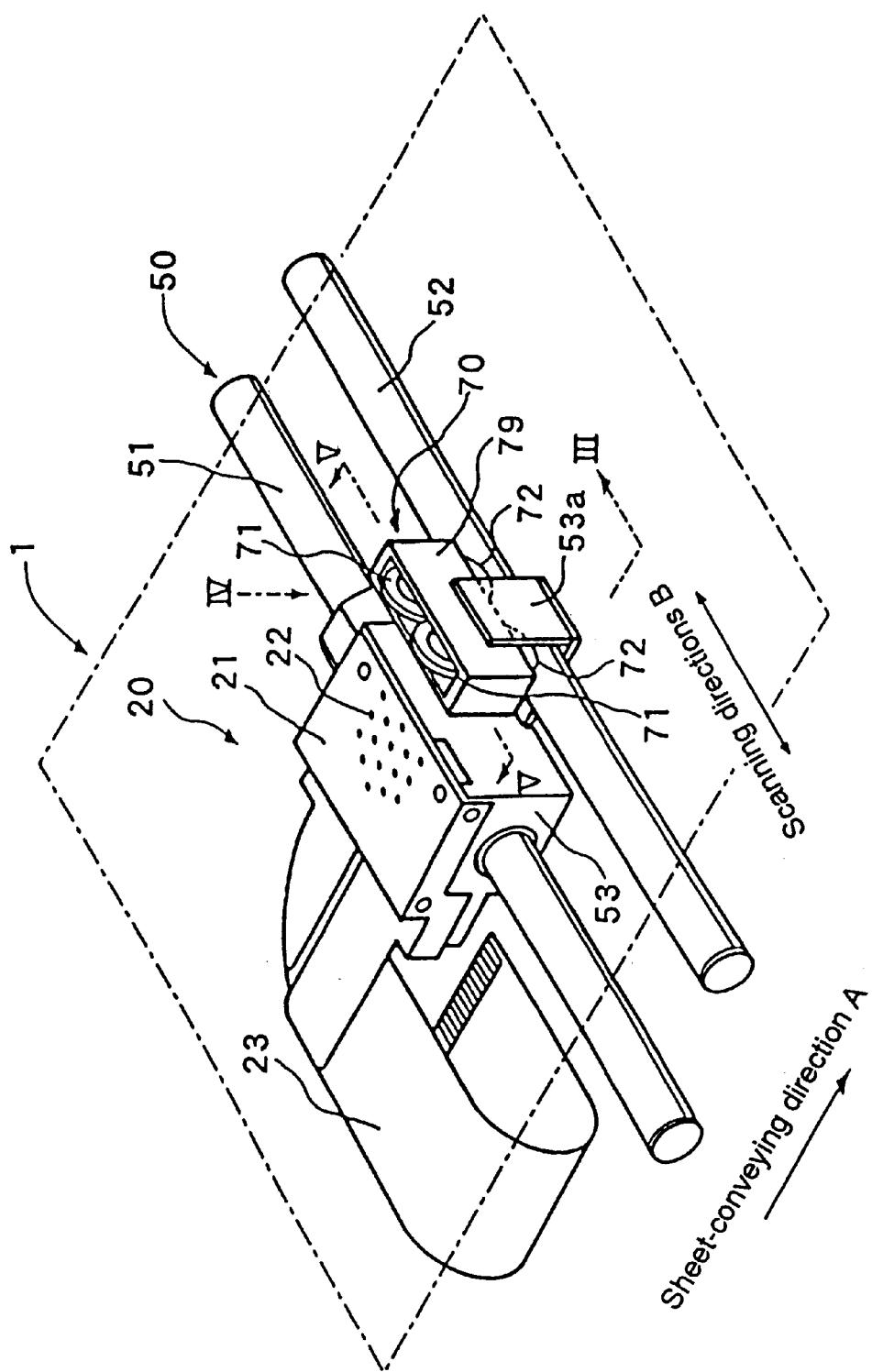
FIG. 2 is a perspective view illustrating a carriage of the recorder in FIG. 1.

The pressure developing unit 70 of the pressure developing mechanism 90 of this embodiment will be described in detail with reference to FIGS. 2, 3, 4 and 5. FIG. 2 is a perspective view schematically illustrating the structure of the pressure developing unit 70, which is shown with the exposure apparatus 20 in that figure. The recording mechanism 50 of the recorder of this example comprises two carriage shafts 51 and 52 extending in parallel with scanning directions B. Supported by the carriage shafts 51 and 52, the carriage 53 reciprocates in the scanning directions B. The pressure developing unit 70 and the exposure unit 20 are mounted on the carriage 53. The exposure unit 20 has an exposure head 21 on which LED's 22 of red (R), green (G) and blue (B) are disposed, so that the exposure head 21 is moved by the carriage 53 in the scanning directions B. The exposure head 21 is connected with a control board (not shown) via a flexible cable 23 and lights up appropriate LED's 22 of each color with a predetermined brightness for each dot of a recording sheet, based on image data supplied from a personal computer or the like, thus irradiating a cyliths on the medium 1. The recorder of the present example is designed to expose cyliths constituting each dot while the exposure head 21 moves in the scanning directions B. Thus, this recorder requires a smaller number of LED's in comparison with an another recorder in which LED's are arranged like an array in the scanning directions. In addition, there is no need to provide a mechanism for controlling differences among individual LED's in comparison with the another recorder. Therefore, the recorder of the present embodiment can print a high-quality image at low costs.

The pressure developing unit 70 of this embodiment comprises a tubular housing 79 shaped like a rectangular parallelepiped. The housing 79 is supported by an arm 53a extending from one side of the carriage 53 and moves together with the exposure head 20. In the housing 79 of the pressure developing unit 70 of this embodiment, two pairs of the first rotating member 71 and the second rotating member 72 are arranged in the scanning directions. It is also possible to pressure develop the cycolor medium 1 using one pair of the first and second rotating members 71 and 72. However, taking into account that the tolerance due to such as wobble and/or slight deviations in the housing 79, there is some possibility to generate an area where no pressure is applied partially or an area where only an insufficient pressure is applied. In consideration of such circumstances, it is desirable to perform pressure development by arranging a plurality of combinations of the first rotating member 71 and the second rotating member 72.

Figure 3:
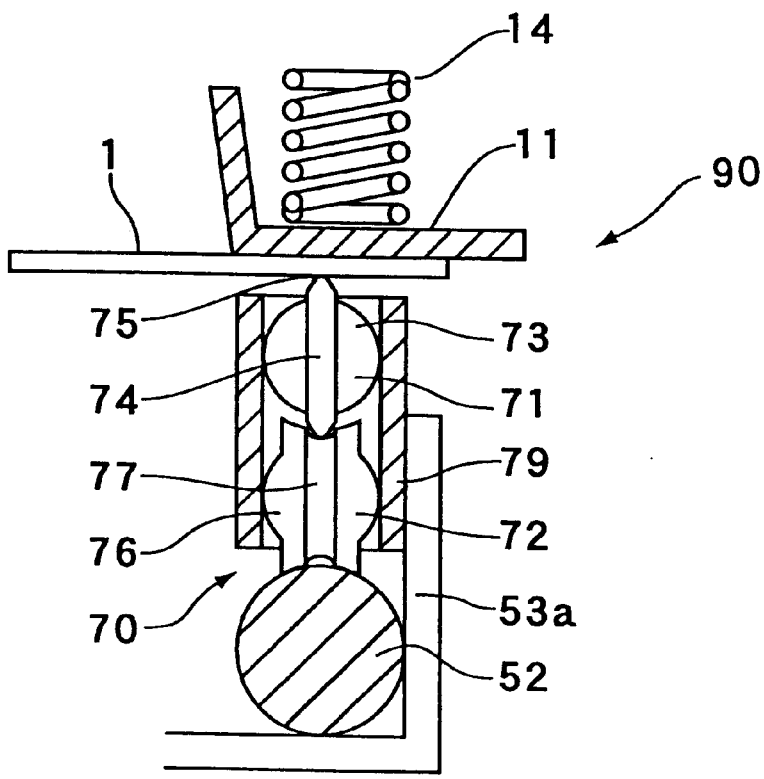
FIG. 3 illustrates a pressure developing mechanism in FIG. 1 in a cross section perpendicular to scanning directions (moving directions).

FIG. 3 schematically illustrates, in a cross section perpendicular to the scanning directions B as the directions of movement, the structure of the pressure developing mechanism 90 of this embodiment having the pressure developing unit 70 and the platen 11. The pressure developing unit 70 of this embodiment has the first and second rotating members 71 and 72 vertically disposed within the housing 79. The first rotating member 71 comprises a substantially spherical body 73 capable of freely rotating on an inner wall of the housing 79 and a pressure ring 74 vertically protruding like a ring from an outer peripheral surface of the body 73. The pressure ring 74 gradually becomes thinner toward a tip 75 thereof. When the first rotating member 71 revolves, the pressure ring 74 becomes contact with the recording sheet 1 over an extremely small area like a point. Therefore, when the first rotating member 71 moves, the pressure ring 74 performs pressure development in a thin continuous line portion of the medium 1. Accordingly, it is possible to apply a high pressure to an extremely small (local) area by sandwiching the medium 1 between the platen 11 and the pressure ring 74. Therefore, by the smaller force, it is possible to produce a high-quality color image that ensures excellent color development.

The second rotating member of the present example comprises a spherical body 76 capable of freely rotating on the inner wall of the housing 79 and a vertically extending groove 77 formed in an outer peripheral surface of the body 76. Hence where the first and second rotating members 71 and 72 are vertically arranged inside the housing 79, the pressure ring 74 of the first rotating member 71 is fitted to the groove 77 of the second rotating member 72. When the first rotating member 71 revolves in one direction, the second rotating member 72 revolves in the other direction and moves along the carriage shaft 52.

Figure 4:
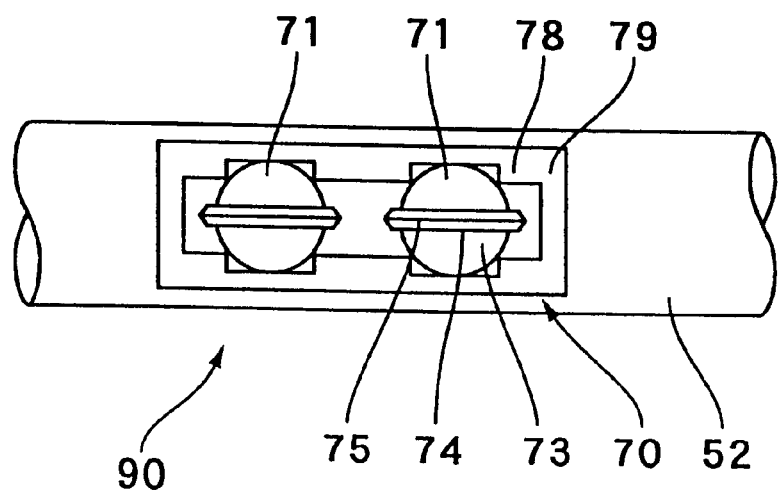
FIG. 4 is a top view of the pressure developing unit illustrated in FIG. 1.

FIG. 4 is a top view of the pressure developing unit 70 of this embodiment. This pressure developing unit 70 accommodates two pairs of the first and second rotating members 71 and 72. Hence, the spherical bodies 73 and 76 are held by corresponding corners 78 that inwardly protrude from the inner wall of the housing 79, so that the first and second rotating members 71 and 72 can turn at predetermined locations. Therefore, the first rotating members 71 do not interfere with each other, neither the second rotating members 72.

Figure 5:
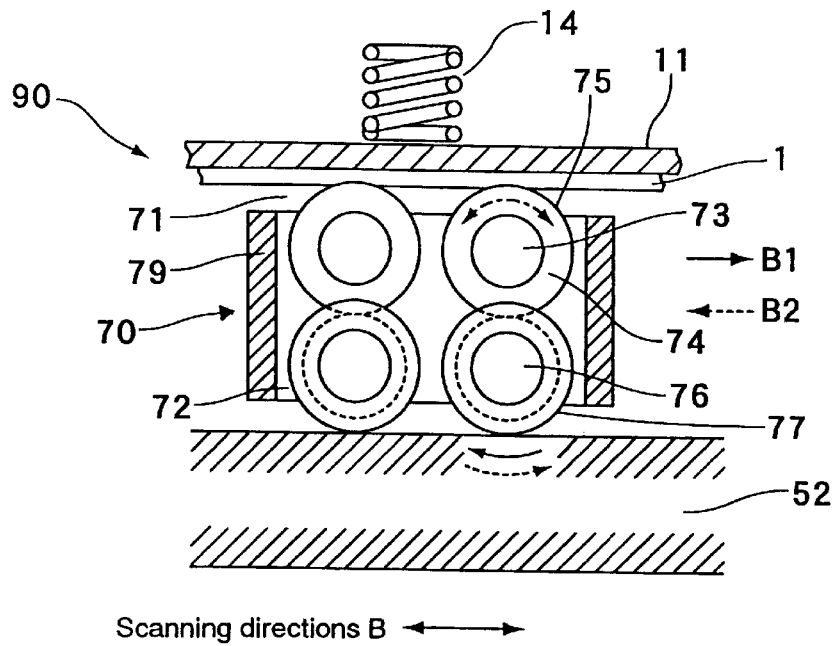
FIG. 5 illustrates the overall structure of the pressure developing mechanism as illustrated in FIG. 1 in a cross section taken along the scanning directions (moving directions).

FIG. 5 illustrates, in a cross section taken along the scanning directions B of the pressure developing unit 70, the structure of the pressure developing mechanism 90 of the present example. In this pressure developing unit 70, if the carriage 53 moves, for example, toward the right side B1 in FIG. 5, the first rotating member 71 moves by revolving counterclockwise. As a result, the recording sheet 1 is sandwiched between the tip 75 of the pressure ring 74 and the platen 11 and locally subjected to a comparatively strong pressure force. Consequently, a process of pressure development is performed in which cyliths in activated state are crushed so as to develop color. On the other hand, the second rotating member 72 moves toward the right side B1 along the carriage shaft 52 that is a supportive member, by revolving clockwise as opposed to the first rotating member 71. Thus, the first and second rotating members 71 and 72 move along the recording sheet and the carriage shaft 52 respectively, by revolving in a direction in which the pressure developing unit 70 moves. The reaction force of a pressure force applied to the recording sheet 1 by the pressure ring 74 is directly transmitted to the carriage shaft 52 via the second rotating member 72. However, since the second rotating member 72 rolls along the carriage shaft 52 in the moving direction B1, there is no sliding friction generated between the carriage shaft 52 and the second rotating member 72. The only resistance to the movement of the pressure developing unit 70 is rolling friction, which exhibits a significantly lower resistance than sliding friction. Hence, even if a high pressure is applied to the printing sheet 1 by the pressure ring 74, the pressure developing unit 70 can be moved in the scanning directions B with a small driving force. This also the same in the case where the pressure developing unit 70 moves toward the left side B2 in FIG. 5. In this case, the first rotating member 71 performs pressure development by revolving clockwise. On the other hand, the second rotating member 72 transmits a load applied to the first rotating member 71 to the carriage shaft 52, by revolving counterclockwise. Accordingly, the carriage 53 on which the pressure developing unit 70 is mounted can be moved with a small driving force. It is thus possible to utilize a drive motor being light in weight, compact in size, low in cost and operable with low power.

Further, in this pressure developing unit 70, the second rotating member 72 transmits a load to the carriage shaft 52 with rotating in the direction to the pressure developing unit 70 moves. Thus, it is unnecessary to temporarily receive a load applied to the first rotating member 71 revolving in the opposite direction to the carriage shaft 52 using an intermediate member such as a spring or the like, then transmit the load to carriage shaft 52 by sliding along. Therefore, the speed of the pressure developing unit 70 does not fluctuate due to a possible change in friction coefficient. Nor does the pressure applied to the recording sheet 1 fluctuate. The pressure developing unit 70 can apply stable and a high pressure to the recording sheet 1. Accordingly, it is possible to develop a homogeneous color image without color irregularities or shade. In addition, it is possible to omit a spring for supporting the first rotating member 71 and a component for supporting the spring. Therefore, it is possible to reduce the pressure developing unit 70 in size and cost.

Since there is no sliding friction generated between the pressure developing unit 70 and the carriage shaft 52, there is no possibility of any portion of the pressure developing unit 70 being worn away. Hence, it is possible to provide a pressure developing unit that can apply a stable pressure force and having a longer life. By employing this pressure developing unit 70, it becomes possible to provide a recorder that has high developing quality, being able to make a beautiful color print, being long-lasting, highly reliable, small in size and low in cost.

Although the first and second rotating members 71 and 72 are vertically disposed in this embodiment, the present invention is not limited to such arrangement. However, in a direction from the printing sheet 1 to the carriage shaft 52, the first rotating member 71 and the second rotating member 72 may be arranged in that order. For example, if the carriage shaft 52 is disposed above the printing sheet 1, the arrangement of the first and second rotating members 71 and 72 is reversed. That is, the first rotating member 71 and the second rotating member 72 are disposed in that order in a bottom-to-top direction. Although one of the first rotating members 71 is supported by one of the second rotating members 72 in the present example, one of the first rotating members 71 may be supported by a plurality of the second rotating members 72, or on the contrary, a plurality of the first rotating members 71 may be supported by one of the second rotating members 72.

Second Embodiment

Figure 6:
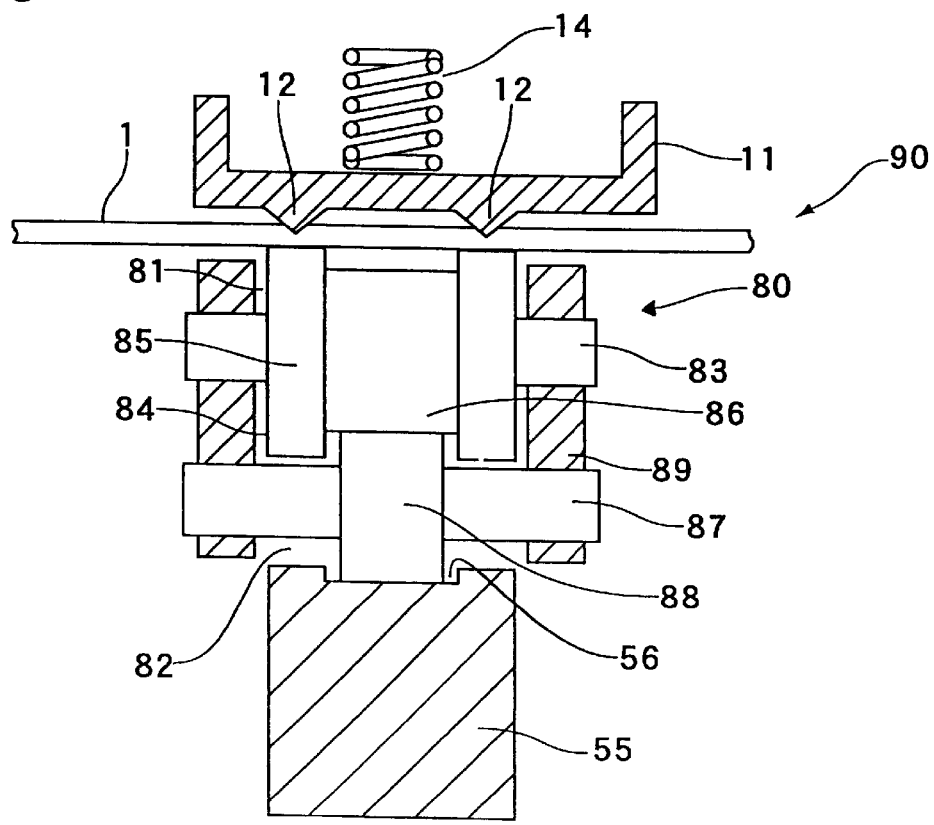
FIG. 6 illustrates another example of the pressure developing mechanism according to the present invention in a cross section perpendicular to the scanning directions (moving directions).

In the pressure developing mechanism 90 described above, the pressure developing unit 70 comprising the first and second rotating members 71 and 72 having spherical bodies is cited as an example. The first and second rotating members may be shaped rotate while being in contact with or being engaged with each other. For example, it is possible to employ the first and second rotating members that are shaped like a roller or a disc, or to employ the first and second rotating members that have gears engaging each other. FIG. 6 illustrates an another example of the first and second rotating members. A pressure developing unit 80 included in the pressure developing mechanism 90 of the present embodiment has a roller-shaped first rotating member 81 and a roller-shaped second rotating member 82 vertically disposed within a housing 89. The first and second rotating members 81 and 82 have shafts 83 and 87, and roller portions 84 and 88 respectively. The shafts 83 and 87 allow the roller portions 84 and 88 to revolve relative to the housing 89 respectively.

In the roller portions 84 of the first rotating member 81, land portions 85 protruding in a circumferential direction are formed on the both ends. A central portion interposed between both the land portions 85 constitutes a groove portion 86 that is set back with respect to the level of the land portions 85. The land portions 85 on both sides face the platen 11 and nip the printing sheet 1 so as to pressurize it.

Further, two rows of protrusions 12 extending in a direction in which the pressure developing unit 80 moves are provided on the platen 11, which is a supportive plate of this pressure developing mechanism 90. By sandwiching the printing sheet 1 between these protrusions 12 and the land portions 85, it is possible to pressurize the printing sheet 1 over a small area almost like a point, and to locally apply a high load to the printing sheet 1. Accordingly, it is possible to apply a pressure sufficient to perform development to the printing sheet 1 using the small roller 81 and to reliably perform pressure development so that a beautiful color print can be provided. On the other hand, the groove portion 86 engages (contacts) the roller portion 88 of the second rotating member 82 and causes the second rotating member 82 to revolve in the opposite direction. Therefore, a load can be transmitted to a carriage shaft 55 as a supportive member via the second rotating member 82. Thus, the pressure developing unit 80 of the present example also allows the first rotating member 81 and the second rotating member 82 to revolve relative to the platen 11 and the carriage shaft 55 respectively in a direction in which the pressure developing unit 80 goes. Thus, it is possible to substantially reduce the driving power in moving the pressure developing unit 80, and to move the pressure developing unit 80 by means of a small motor. The pressure developing unit 80 of the present example also has a quite simple structure in which the two rotary members 81 and 82 are vertically disposed. Accordingly, it is possible to provide a pressure developing unit that is compact, inexpensive, reliable and almost free from quality unevenness or trouble.

Since the pressure developing unit 80 of this embodiment is designed to move by rolling or rotating along the surface of the carriage shaft 55, it is unnecessary to employ a cylindrical carriage shaft. As illustrated in FIG. 6, it is also possible to employ the carriage shaft 55 which has a shape of a polygonal column having a cross section of a triangle, a quadrangle and so on. It is further possible to precisely determine a direction in which the pressure developing unit 80 moves by forming the groove 56 along which the second rotating member 82 rolls in the carriage shaft 55.

Third Embodiment

The cycolor medium 1 had, generally, exposed areas extend along four edges of the medium 1 for constituting a blank (white) frame of a predetermined width. In this case, it is almost unnecessary to consider developing the edge portions of the medium. On the other hand, it is considered to make the entire area of the medium available to users so that the recorder can expose the areas extending along four edges of the medium. Accordingly, it is also desired that the pressure developing unit be capable of performing pressure development by applying a homogeneous pressure to the areas extending along the edges of the medium.

Figure 7:
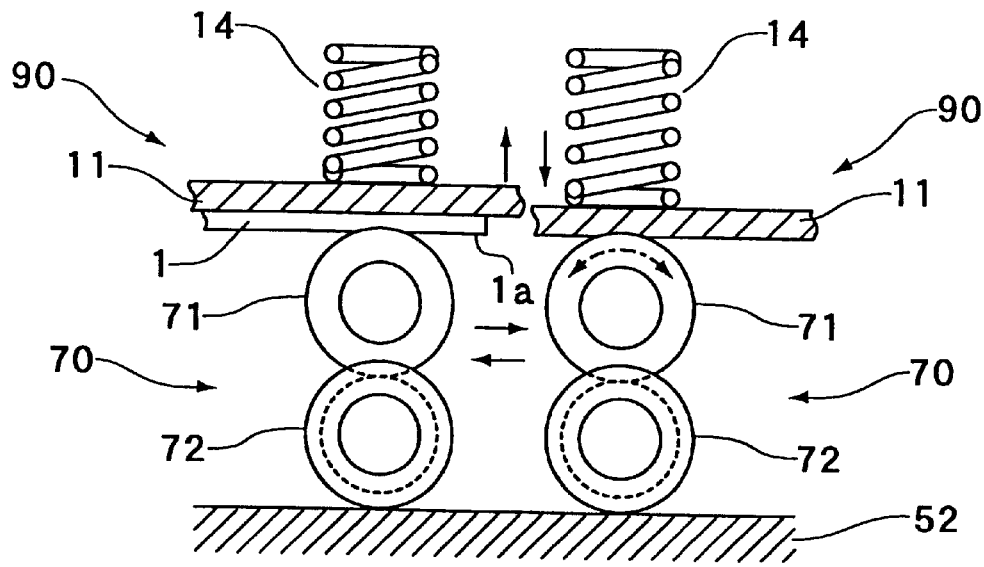
FIG. 7 illustrates the movement of the pressure developing mechanism employing the pressure developing unit illustrated in FIG. 5 in the vicinity of an edge portion of a recording sheet.

As illustrated in FIG. 7, the platen 11 is pressed against the first rotating member 71 by an elastic member such as a coil spring 14. The platen 11 can apply a suitable pressure to the medium 1 of moderate thickness when it is inserted between the platen 11 and the first rotating member 71. In addition, since the platen 11 is elastically supported to generate a sufficient pressure, it is possible to perform development under a suitable pressure, even if the medium 1 varies in thickness. Even if the first rotating member 71 has erection tolerances or is slightly worn away, it is possible to obtain a pressure sufficient to perform development without any problem.

As illustrated in FIG. 7, when the pressure developing unit 70 passes an edge 1a of the medium 1, the coil spring 14 pushes the platen 11 so as to compensate for lack of the thickness of the medium 1. Thus, the contact between the platen 11 and the first rotating member 71 is kept. Conversely, when the pressure developing unit 70 runs onto the edge 1a of the medium 1, the coil spring 14 contracts so as to compensate for the thickness of the medium 1, whereby the pressure developing unit 70 can perform pressure development of the medium 1 under a suitable pressure. If the coil spring 14 extends or contracts when the pressure developing unit 70 runs onto the edge 1a of the medium 1, the platen 11 may slightly vibrate. In the case where the areas extending along the edges 1a of the medium 1 constitute a blank frame, it is unnecessary to perform pressure development of those areas. Therefore, no problem is caused. However, in the case where the areas in the vicinity of the edges 1a of the medium 1 are available to users, if the platen 11 vibrates in the vicinity of the edges 1a, the pressure applied to the medium 1 may fluctuate enough to cause a color shade or irregularity. That is, the color image thus developed may have streaks of different color densities along the edges 1a of the medium 1.

Figure 8:
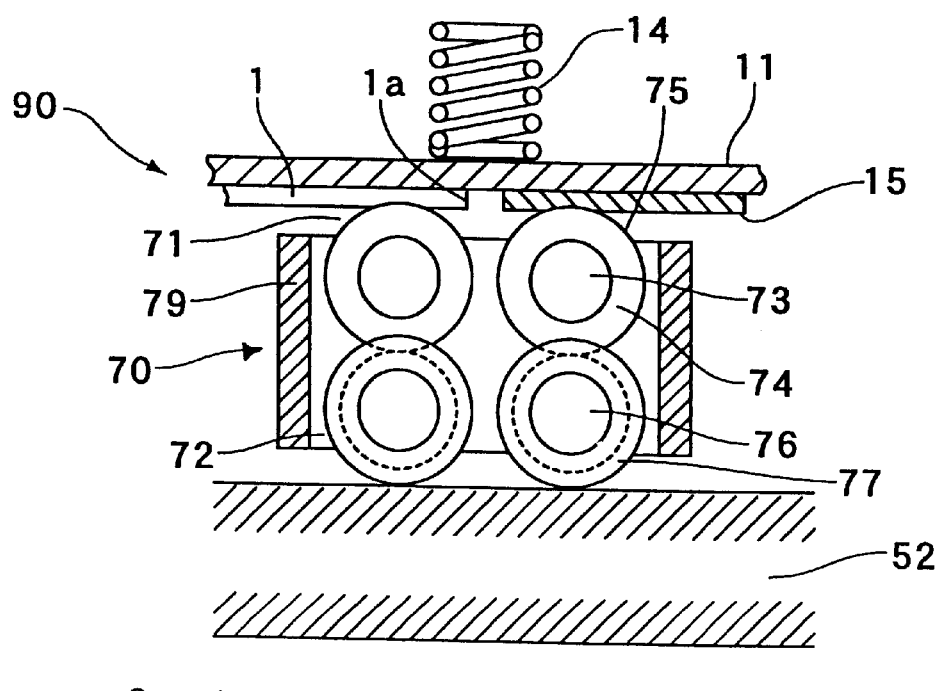
FIG. 8 schematically illustrates an example that prevents fluctuations of a developing pressure applied to the edge portion of the recording sheet.

As illustrated in FIG. 8, if a guide plate 15 that is almost as thick as the medium 1 is disposed on the platen 11 along the edge 1a of the medium 1, it is possible to almost completely eliminate the influences of vibration of the platen 11 exerted when the first rotating member 71 passes the edge 1a of the medium 1. Accordingly, it is possible to perform pressure development under a homogeneous pressure even in the vicinity of the edges 1a and to prevent the generation of a color irregularity. However, this system requires that the medium 1 be conveyed precisely enough to prevent the first rotating member 71 from falling into a gap between the guide plate 15 and the edge 1a. However, if a minute angular deviation (skew) is caused in conveying the medium 1, the edge 1a of the medium 1 and the guide plate 15 may easily overlap or form therebetween a gap into which the first rotating member 71 tends to fall. Therefore, the method as illustrated in FIG. 8 may not reliably prevent the generation of color nonuniformity.

Figure 9:
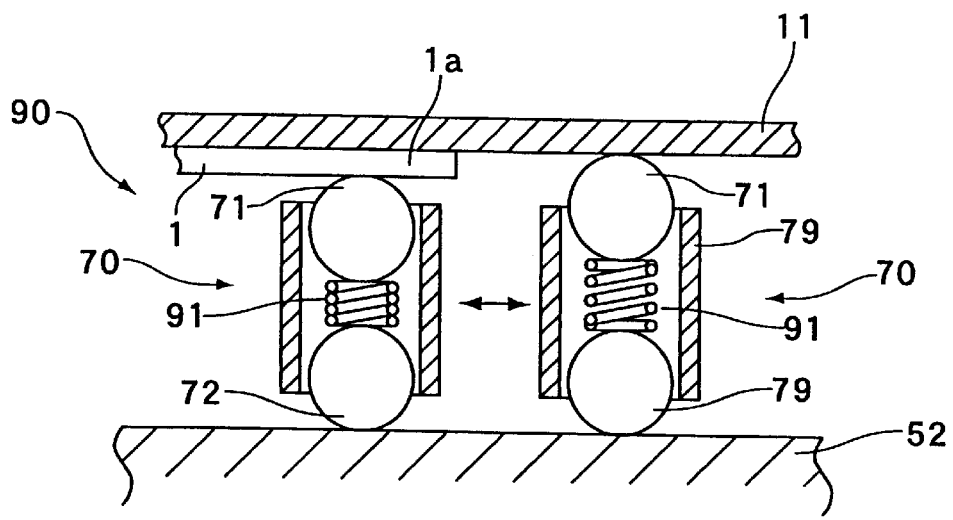
FIG. 9 schematically illustrates an example of the pressure developing mechanism capable of inhibiting fluctuations of the pressure applied to the edge portion of the recording sheet.

FIG. 9 schematically illustrates another example of the pressure developing mechanism 90 of the present invention. Those components that are commonly used in the foregoing and following embodiments are denoted by the same reference numerals, and the detail thereof will be described. In this pressure developing unit 70, a coil spring 91 is disposed between the first rotating member 71 for pressurizing the medium 1 and the second rotating member 72 moving by revolving along the carriage shaft 52 being a supportive member. Therefore, the coil spring 91 elastically transmits a load applied to the first rotating member 71 to the second rotating member 72. When the first rotating member 71 runs onto the edge 1a of the medium 1, the coil spring 91 contracts so that the pressure developing unit 70 of the present example can develop the medium 1 under a suitable pressure. Since this pressure developing unit 70 has the coil spring 91 extends or contracts when the first rotating member 71 runs onto the edge 1a of the medium 1, the first rotating member 71 may tend to vibrate, nevertheless, non of color irregularities occur in the areas extending along the edges 1a. Thus, it is possible to obtain a clear color image having no streaks of different color densities. In the pressure developing unit 70 of the present embodiment, it is the first rotating member 71 that is elastically supported, and the first rotating member 71 is much lighter than the platen 11. Therefore, even if the first rotating member 71 runs onto the edge 1a and vibrates, such vibration is rapidly damped and thus does not adversely affect the quality of pressure development. This is regarded as the reason why a clear color image can be obtained.

By elastically connecting the first rotating member 71 with the second rotating member 72 in this manner, the pressure developing unit 70 of the present example absorbs the thickness of the medium 1. In addition, it is also possible to perform pressure development of the medium 1 under a suitable pressure even if the first rotating member 71 has erection tolerances or is worn away. Accordingly, the pressure developing mechanism 90 of this example can fix the platen 11 without elastically supporting it, which platen is a sheet-supporting member that holds the recording sheet 1 from the side opposite to the first rotating member 71. Therefore, vibration of the platen 11 can be prohibited. Consequently, it is possible to prevent color nonuniformity being caused in the vicinity of the edges 1a of the medium 1, and to actually expose the areas extending along the edges 1a of the medium 1. Thus, it is possible to abolish a blank frame on the cycolor medium 1 and to provide the medium 1 which can be used all over by a user, a recorder and a printing method therefor. Hence, the user can obtain a color print on which an image stretches all over.

In addition, as is the case with the aforementioned pressure developing unit, in this pressure developing unit 70, it is also designed to transmit a load applied to the first rotating member 71 to the second rotating member 72 which moves by revolving along the carriage shaft 52. Therefore, the pressure developing unit 70 can be moved with a considerably small driving force. Thus, as is the case with the aforementioned examples, the pressure developing unit 70 of the present example can realize a recorder that is compact in size, light in weight, suited for conveyance and usable with low power consumption. Further, it is possible to provide a recorder that print that can produce a color print with no blank frames using a cycolor medium 1.

Figure 10:
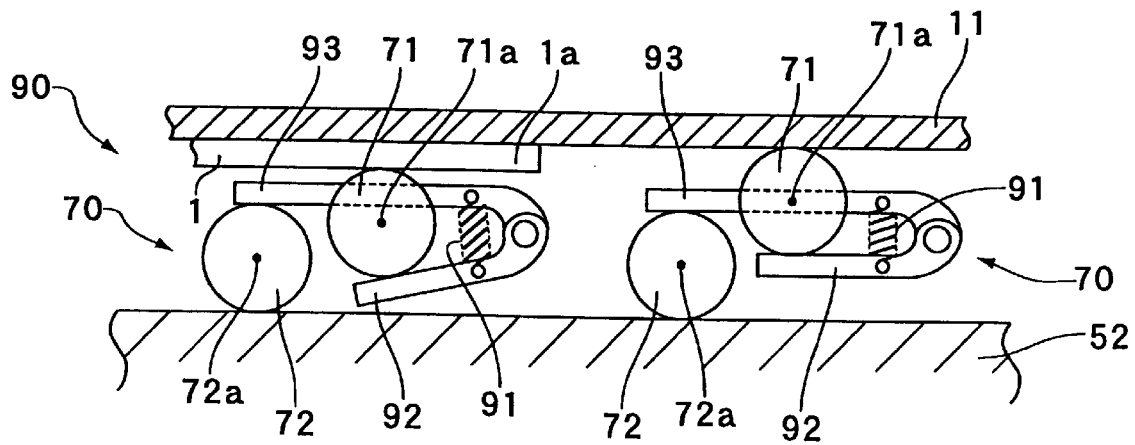
FIG. 10 schematically illustrates another example of the pressure developing mechanism according to the present invention.

FIG. 10 illustrates still another example of the pressure developing mechanism 90 according to the present invention. In the pressure developing unit 70 of the present embodiment, a center of rotation 72o of the second rotating member 72 is offset relative to a center of rotation 71o of the first rotating member 71. These first and second rotating members 71 and 72 are supported by first and second arms 92 and 93 respectively, which are different in length. In addition, the arms 92 and 93 are elastically connected with each other by the coil spring 91.

The pressure developing unit illustrated in FIG. 9 has the first and second rotating members 71 and 72, and the coil spring 91 linearly arranged, so that the distance between the first and second rotating members 71 and 72 is large.

Therefore, the space between the carriage shaft 52, along which the pressure developing unit 70 reciprocates, and the platen 11 is wider. Thus, the recorder needs to ensure an ample space for accommodating the pressure developing unit 70, the carriage shaft 52 and the platen 11. On the other hand, the pressure developing unit 70 as illustrated in FIG. 10 adopts an arrangement in which the center of rotation 72o of the second rotating member 72 is displaced relative to the center of rotation 71o of the first rotating member 71. Therefore, it is possible to make the distance between the carriage shaft 52 and the platen 11 shorter than in the case where the first and second rotating members 71, 72 are linearly arranged in a direction perpendicular to the platen 11. Accordingly, the pressure developing mechanism 90 can be installed in a narrow space. In particular, it is possible to provide the pressure developing mechanism 90 suited to realize the recorder 10 being entirely thin. Further, as is the case with the pressure developing unit as illustrated in FIG. 9, it is possible to prevent color irregularities caused on the edges 1a by elastically connecting the first and second rotating members 71 and 72 with the arms 92 and 93 respectively, using the coil spring 91 as an elastic member.

Although the pressure developing unit 70 as illustrated in FIG. 10 has the first and second rotating members 71, 72 spaced apart from each other, it is also possible to arrange these rotary members 71 and 72 may contact each other. Instead of the coil spring 91, a leaf spring or an elastic body made of other materials such as rubber can be used. It is also evident in the other embodiments previously mentioned or to be explained that other members can be used instead of the coil spring to obtain elasticity.

Figure 11:
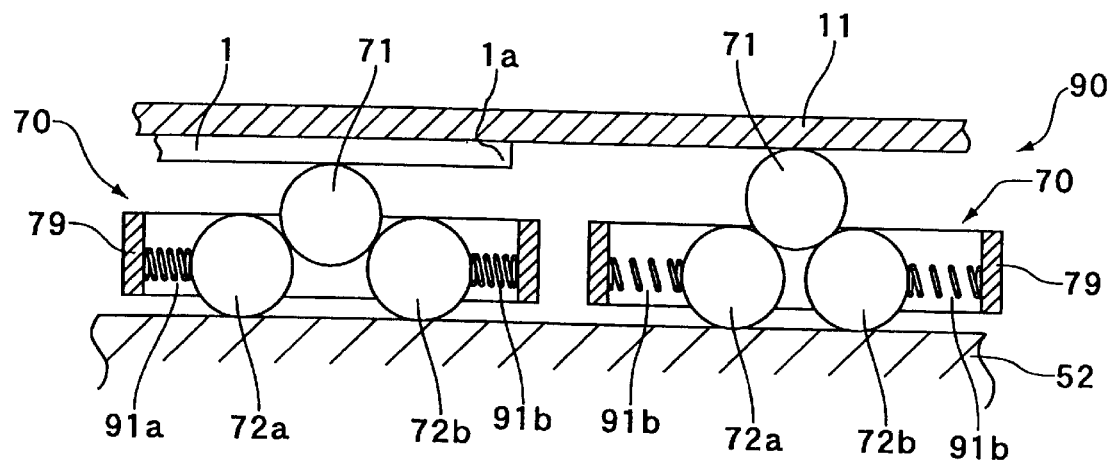
FIG. 11 schematically illustrates still another example of the pressure developing mechanism according to the present invention.

FIG. 11 illustrates still another example of the pressure developing mechanism 90 according to the present invention. The pressure developing unit 70 of the present embodiment has two pieces of the second rotating member 72a and 72b. In addition, a first rotating member 71 is disposed so as to contact both the second rotating members 72a and 72b. The respective second rotating members 72a and 72b are elastically held by coil springs 91a and 91b in a direction to reduce the distance between the rotating members 72a and 72b. In this pressure developing unit 70, an arrangement in which centers of rotation of the second rotating members 72a and 72b are offset with respect to a center of rotation of the first rotating member 71, is also adopted. Hence, it is possible to reduce the distance between the platen 11 and the carriage shaft 52. Further, the pressure developing unit 70 of the present embodiment is designed to absorb the thickness of the medium 1 due to an arrangement in which the first rotating member 71 increases the distance between the second rotating members 72a and 72b. Since the two rotary members 72a and 72b are elastically supported (held) in such a direction as to reduce the distance therebetween, the first rotating member 71 can be pressed against the medium 1 under a suitable pressure.

Accordingly, this pressure developing unit 70 is also able to smoothly move past the edge 1a of the medium 1 and to perform pressure development of the medium 1 without generating color irregularities on the medium 1. In addition, the two second rotating members 72a and 72b turn in a direction of moving of the pressure developing unit 70 along the carriage shaft 52. Therefore, as is the case with the pressure developing units of the foregoing examples, this pressure developing unit 70 can be moved with a small driving force.

Although two pieces of the second rotating member 72 are provided in the present example, two pieces of the first rotating member 71 may also be provided instead. In the case where two pieces of the first rotating member 71 are provided, it is desirable to elastically hold the first rotating members so as to prevent increasing the distance between the two rotating members 71. In addition, the pressure developing unit 70 may have more than three pieces of the first rotating members 71 or the second rotating members 72.

Figure 12:
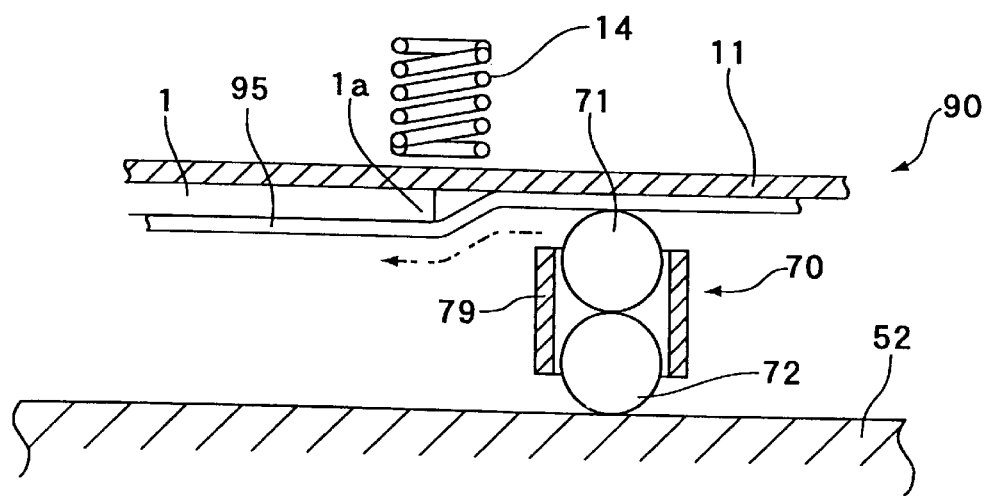
FIG. 12 schematically illustrates an example of the pressure developing mechanism according to the present invention in which a guide member is used.

FIG. 12 illustrates still another embodiment of the pressure developing mechanism 90 according to the present invention. This pressure developing mechanism 90 comprises the pressure developing unit 70 having the housing 79 in which the first rotating member 71 and the second rotating member 72 are directly in contact with each other. The pressure developing unit 70 is designed to reciprocate along the carriage shaft 52 on the surface of the platen 11. Further, a metallic wire is provided as a guide member 95 along a route followed by the first rotating member 71, therefore, the first rotating member 71 presses the recording sheet 1 via the guide member 95. As the guide member 95, a thin deformable wire of metal or plastics or a thin band plate can be employed.

If the recording sheet exist, the deformable guide member 95 changes its shape in accordance with a cross section of the recording sheet 1. In the vicinity of the edge 1a, the guide member 95 gradually deforms from a shape according to the platen 11 to a shape according to the recording sheet 1. Thus, the shape of the guide member 95 is changed to relatively smooth in comparison with the stair-like edge 1a of the medium 1. Hence, if the first rotating member 71 moving along the guide member 95 runs onto the recording sheet 1 from the platen 11, the coil spring 14 elastically supporting the platen 11 is gradually displaced. Therefore, even if the platen 11 vibrates the moment the pressure developing unit 70 has run onto the recording sheet 1, the amplitude of such vibration becomes considerably small. Thus, it is possible to inhibit pressure fluctuations in performing pressure development of the areas extending along the edges 1a so as to obtain a color image free from a color shade (nonuniformity, irregularity) even in those areas.

This pressure developing mechanism 90 also employs the pressure developing unit 70 comprising the first and second rotating members 71 and 72, and the pressure developing unit 70 can be moved with a small driving force. Accordingly, as is the case with the foregoing examples, the present pressure developing mechanism 90 is also suited to realize a compact recorder having a compact motor and being low in power consumption.

Figure 13:
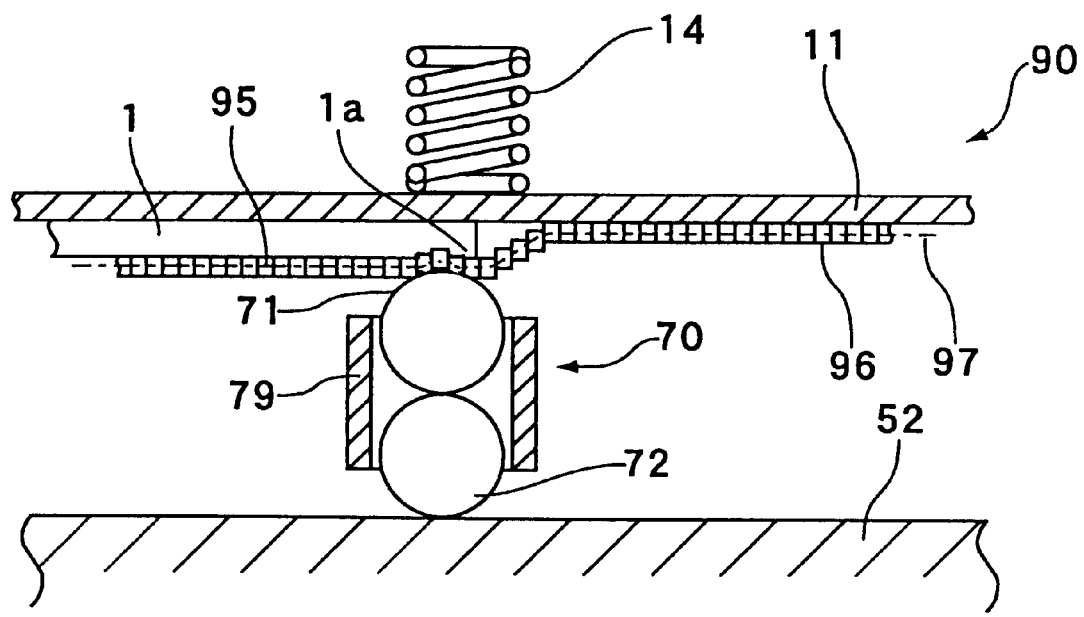
FIG. 13 schematically illustrates still another example of the pressure developing mechanism according to the present invention.
Figure 14:
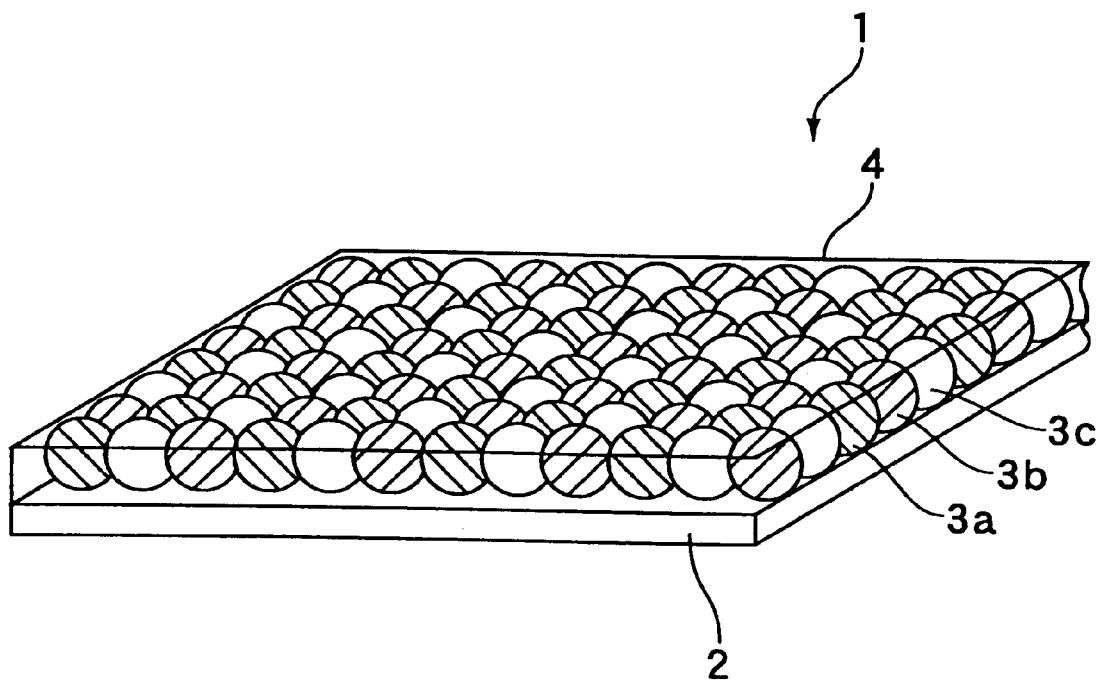
FIG. 14 is an illustrative view schematically illustrating a cycolor medium.

FIG. 13 illustrates still another embodiment of the pressure developing mechanism 90. The pressure developing mechanism 90 of the present embodiment uses a number of small pieces 96 connected with one another by a superfine wire or the like as the guide member 95 for smoothly guiding the first rotating member 71 of the pressure developing unit 70 onto the recording sheet 1. By using a continuous member such as a wire as a guide member, the pressure developing mechanism as illustrated in FIG. 12 can inhibit pressure fluctuations when the first rotating member 71 moves past the edge 1a. However, since the first rotating member 71 pressurizes the recording sheet 1 via the guide member, the dimension of contact area of the guide member and the recording sheet 1 tends become larger than the contact area of the recording sheet 1 which is directly pressurized by the first rotating member 71. Therefore, the quality of color development may deteriorate due to the lack of pressure. Or, to apply sufficient pressure for development to the recording sheet 1, the platen 11 needs to be pressed against the pressure developing unit 70 under a greater force. In that case, the resistance resulting from rolling friction in moving the pressure developing unit 70 increases.

The pressure developing mechanism 90 illustrated in FIG. 13 employs as the guide member 95 an assembly of the small pieces 96 connected with one another, which small pieces 96 can be slightly displaced with respect to one another. Thus, the first rotating member 71 pressurizes the recording sheet 1 over a limited area substantially corresponding to the areas defined by the small pieces 96. The guide member 95 of the present example contacts the recording sheet 1 over a small area and thus can inhibit pressure reduction. Therefore, it is possible to prevent the quality of color development from being adversely affected, or to prevent the increasing the driving power for moving the pressure developing unit 70 due to excess press from the platen 11.

As described based on the embodiments above, the pressure developing apparatus (unit) and the pressure developing mechanism according to the present invention have a first rotating member for pressurizing a recording sheet such as a cycolor medium that necessitates pressure development, and a second rotating member that transmits a load applied to the first rotating member to a supportive member such as a carriage shaft and can rotate in a direction opposed to the first rotating member. These first and second rotating members revolve to the recording sheet and the supportive member respectively in a direction corresponding to a direction in which the pressure developing apparatus moves. While rolling, the first rotating member applies a suitable pressure to the recording sheet. While rolling, the second rotating member can transmit a load applied to the first rotating member to the supportive member. As described above, the first and second rotating members do not need to have a spherical shape. A member that can rotate, turn or roll and the like, shaped like a disc, a roller or the like can be used as the first rotating member and/or the second rotating member. The pressure developing apparatus and the pressure developing mechanism according to the present invention can eliminate those portions that move with sliding against to the recording sheet and/or the supportive member. Accordingly, the pressure developing unit/apparatus is able to considerably smoothly move relative to the recording sheet. Thus, it is possible to perform pressure development without developing flaws or wrinkles serious enough to damage the printing sheet. The pressure developing apparatus moves along the supportive member, causing only rolling friction. Consequently, the amount of abrasion can be reduced, and the pressure developing apparatus can be moved with a considerably small driving force. As a result, in the present invention, a motor that is compact and operable with low power can move the pressure developing apparatus. That is, the pressure developing apparatus according to the present invention is able to realize a recorder that is compact in size and operable with low power consumption.

In particular, the recorder adopting the pressure developing apparatus according to the present invention makes it possible to move both the pressure developing apparatus and the exposure apparatus by mounting them on the carriage. And, all the motions including the motions for displacing the carriage, conveying the sheet and so forth can be achieved with a single motor. In addition, the pressure developing apparatus according to the present invention can reduce the driving power necessary for the carriage, which requires the greatest power consumption among those components controlled by the motor. Therefore, the only motor or the main motor of the recorder can be realized as a compact motor that is operable with low power. Thus, the pressure developing apparatus according to the present invention makes it possible to reduce the recorder in size, electric power and manufacturing cost. Since the electric power consumption can be substantially reduced, it is possible to realize a compact recorder that is suited for conveyance and operable for a long period of time with a power source of limited energy such as a battery.

Further, the pressure developing apparatus according to the present invention can be accommodated in a thin narrow space, whereby it is possible to reduce the recorder in size, particularly in thickness. In addition, the cycolor medium enables color printing without necessitating the use of consuming supplies such as ink. Hence, it is possible to provide the recorder having the pressure developing apparatus according to the present invention for using the cycolor medium as a recording medium being compact in size and capable of easily performing color printing at any time.

INDUSTRIAL APPLICABILITY

The pressure developing apparatus and the pressure developing mechanism according to the present invention are suited for a recorder that performs color printing on a recording medium such as a cycolor medium that requires pressure for printing. By employing the pressure developing apparatus according to the present invention, it is possible to provide a recorder that is compact in size, suited for personal use and operable at any time and at any place.

What is claimed is:

1. A pressure developing apparatus moving along a supportive member to perform pressure development of a recording sheet, comprising:
    a first rotating member moving by revolving to pressurize a recording sheet; and
    a second rotating member moving by revolving with respect to said supportive member to move therealong, said second rotating member being able to transmit a load applied to said first rotating member to said supportive member.

2. A pressure developing apparatus according to claim 1, wherein said first rotating member moves by revolving while pressurizing the recording sheet and said second rotating member moves by revolving between said first rotating member and said supportive member while being in contact with said first rotating member and said supportive member.

3. A pressure developing apparatus according to claim 1, further comprising a transmission apparatus elastically transmitting a load applied to said first rotating member to said second rotating member.

4. A pressure developing apparatus according to claim 1, characterized by an arrangement in that a center of rotation of said second rotating member is offset relative to a center of rotation of said first rotating member.

5. A pressure developing apparatus according to claim 1, wherein the pressure developing apparatus has a plurality of said first or second rotating members and at least one of said first or second rotating members moves by revolving while being in contact with a plurality of said second or first rotating members.

6. A pressure developing apparatus according to claim 5, further comprising a holding apparatus for applying an elastic force in such a direction as to reduce a distance among said plurality of first rotating members or among said plurality of second rotating members.

7. A pressure developing apparatus according to claim 1, wherein said supportive member is a carriage shaft extending in scanning directions of the recording sheet.

8. A pressure developing apparatus according to claim 1, wherein said first rotating member has a shape for contacting the recording sheet over a narrow continuous area.

9. A pressure developing mechanism having a pressure developing apparatus according to claim 1 and a sheet supporting member for supporting a recording sheet from a side opposite to said first rotating member, wherein said pressure developing apparatus moves along a defined path, and wherein a protrusion extends from the sheet supporting member along a path which follows a path of movement of said first rotating member such that the recording sheet is pressurized against the protrusion.

10. A pressure developing mechanism having a pressure developing apparatus according to claim 1, a sheet supporting member for supporting a recording sheet from a side opposite to said first rotating member, and a pressure supporting apparatus for elastically supporting said sheet supporting member to said first rotating member while applying pressure thereto.

11. A pressure developing mechanism according to claim 10, wherein a guide member that is deformable into a smooth shape in accordance with a cross section of the recording sheet is provided between said first rotating member and the recording sheet along a direction in which said first rotating member moves.

12. A pressure developing mechanism according to claim 11, wherein said guide member is a number of small divided pieces ranging along a direction in which said first rotating member moves.

13. A recorder comprising:

a pressure developing apparatus according to claim 1;

an exposure apparatus for exposing a photosensitive recording sheet;

a sheet-conveying apparatus for conveying the recording sheet exposed by said exposure apparatus to said pressure developing apparatus; and a driving apparatus for causing said pressure developing apparatus to reciprocate along said supportive member which extends in scanning directions substantially perpendicular to the sheet-conveying direction of said sheet-conveying apparatus.

14. A recorder according to claim 13, wherein said exposure apparatus is able to move along said supportive member and said driving apparatus causes said exposure apparatus to reciprocate together with said pressure developing apparatus along said supportive member.

15. A pressure developing apparatus for performing pressure development of a recording sheet, comprising:

a supportive member extending along a pressure developing location;

a first rotating member moving by revolving to pressurize the recording sheet; and a second rotating member moving by revolving relative to said supportive member as it moves therealong, said second rotating member being positioned to transmit a load applied to said first rotating member to said supportive member, and said first rotating member moving with said second rotating member in a direction defined by said supportive member.

16. A pressure developing apparatus for performing pressure development of a recording sheet which moves along a defined path, comprising:

a supportive member extending at least partially across the defined path of the recording sheet;

a first rotating member moving at least partially across the defined path of the recording sheet by revolving to pressurize the recording sheet; and a second rotating member moving at least partially across the defined path of the recording sheet by revolving with respect to said supportive member, said second rotating member transmitting a load applied to said first rotating member to the supportive member, and said first rotating member moving with said second rotating member in a direction defined by said supportive member.

* * * * *